United States Patent
Yoon et al.

(10) Patent No.: US 8,310,874 B2
(45) Date of Patent: Nov. 13, 2012

(54) NON-VOLATILE MEMORY DEVICE

(75) Inventors: Jung Hyuk Yoon, Anyang (KR); Dong Keun Kim, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 97 days.

(21) Appl. No.: 12/962,297

(22) Filed: Dec. 7, 2010

(65) Prior Publication Data

US 2012/0051170 A1    Mar. 1, 2012

(30) Foreign Application Priority Data

Aug. 30, 2010   (KR) .................. 10-2010-0084017

(51) Int. Cl.
*G11C 16/06* (2006.01)
(52) U.S. Cl. .............................. 365/185.13; 365/230.03
(58) Field of Classification Search ............. 365/185.13, 365/230.03
See application file for complete search history.

(56) References Cited

U.S. PATENT DOCUMENTS

| | | | |
|---|---|---|---|
| 5,751,653 A | 5/1998 | Chung et al. | |
| 2002/0176272 A1* | 11/2002 | DeBrosse et al. | 365/97 |
| 2004/0174756 A1* | 9/2004 | Kunikiyo et al. | 365/200 |
| 2005/0117437 A1 | 6/2005 | Lee et al. | |
| 2011/0292749 A1 | 12/2011 | Park et al. | |

FOREIGN PATENT DOCUMENTS

| | | |
|---|---|---|
| KR | 100203141 B1 | 3/1999 |
| KR | 20050052743 A | 6/2005 |
| KR | 100909754 B1 | 7/2009 |
| KR | 20110130155 A | 12/2011 |

* cited by examiner

*Primary Examiner* — Tuan T. Nguyen

(57) ABSTRACT

A non-volatile memory device includes a cell array configured to read or write data, a local column switch configured to selectively connect a bit line of the cell array to a global bit line in response to a column selection signal, a global column switch configured to selectively connect the global bit line to a sense-amp in response to an enable signal, and a switching unit configured to selectively connect or sever a current path of the global column switch in response to a control signal corresponding to a bank active operation.

22 Claims, 6 Drawing Sheets

<Prior Art>

NON-VOLATILE MEMORY DEVICE

CROSS-REFERENCE TO RELATED APPLICATION

The priority of Korean patent application No. 10-2010-0084017 filed on Aug. 30, 2010, the disclosure of which is hereby incorporated in its entirety by reference, is claimed.

BACKGROUND OF THE INVENTION

Embodiments of the present invention relate to an integrated circuit (IC) and a non-volatile memory that are configured to read or write data in response to resistance variation.

Memory devices may be classified into a volatile memory device and a non-volatile memory device. The non-volatile memory device includes a non-volatile memory cell capable of preserving stored data even when not powered. For example, the non-volatile memory device may be implemented as a flash random access memory (flash RAM), a phase change random access memory (PCRAM), or the like.

The PCRAM includes a memory cell that is implemented using a phase change material such as germanium antimony tellurium (GST), wherein the GST changes to a crystalline phase or an amorphous phase if heat is applied to the GST, thereby storing data in the memory cell.

A non-volatile memory device (e.g., a magnetic memory, a phase change memory (PCM), or the like) has a data processing speed similar to that of a volatile RAM device. The non-volatile memory device also preserves data even when power is turned off.

FIGS. 1A and 1B illustrate a conventional phase change resistor (PCR) element 4.

Referring to FIGS. 1A and 1B, the PCR element 4 includes a top electrode 1, a bottom electrode 3, and a phase change material (PCM) layer 2 located between the top electrode 1 and the bottom electrode 3. If a voltage and a current are applied to the top electrode 1 and the bottom electrode 3, a current signal is provided to the PCM layer 2, and a high temperature is induced in the PCM layer 2, such that an electrical conductive status of the PCM layer 2 changes depending on resistance variation.

FIGS. 2A and 2B illustrate a phase change principle of the conventional PCR element 4.

Referring to FIG. 2A, if a low current smaller than a threshold value flows in the PCR element 4, the PCM layer 2 has a temperature suitable for a crystalline phase. Therefore, the PCM layer 2 changes to the crystalline phase, such that it is changed to a low-resistance phase material. As a result, a current may flow between the top electrode 1 and the bottom electrode 3.

On the other hand, as shown in FIG. 2B, if a high current greater than the threshold value flows in the PCR element 4, the PCM layer 2 has a temperature higher than a melting point. Therefore, the PCM layer 2 changes to an amorphous phase, such that it is changed to a high-resistance phase material. As a result, it is difficult for the current to flow between the top electrode 1 and the bottom electrode 3.

As described above, the PCR element 4 can store data corresponding to two resistance phases as non-volatile data. For example, assuming that one case in which the PCR element 4 has a low-resistance phase is set to data '1' and the other case in which the PCR element 4 has a high-resistance phase is set to data '0', the PCR element 4 may store two logic states of data.

In addition, a phase of the PCM layer (i.e., a phase change resistive material) 2 is not changed although the phase change memory device is powered off, such that the aforementioned data can be stored as non-volatile data.

FIG. 3 illustrates a write operation of a conventional PCR cell.

Referring to FIG. 3, when a current flows between the top electrode 1 and the bottom electrode 3 of the PCR element 4 for a predetermined time, heat is generated.

Assuming that a low current smaller than a threshold value flows in the PCR element 4 during the predetermined time, the PCM layer 2 has the crystalline phase formed by a low-temperature heating state, such that the PCR element 4 becomes a low-resistance element having a set state.

Otherwise, assuming that a high current greater than the threshold value flows in the PCR element 4 during the predetermined time, the PCM layer 2 has the amorphous phase formed by a high-temperature heating state, such that the PCR element 4 becomes a high-resistance element having a reset state.

By means of the aforementioned properties, in order to write data of the set state during the write operation, a low voltage is applied to the PCR element 4 for a long period of time. On the other hand, in order to write data of the reset state during the write operation, a high voltage is input to the PCR element 4 for a short period of time.

The PCR memory device outputs a sensing current to the PCR element 4 during a sensing operation, such that it can sense data written in the PCR element 4.

BRIEF SUMMARY OF THE INVENTION

Various embodiments of the present invention are directed to providing a non-volatile memory device that substantially obviates one or more problems due to limitations and disadvantages of the related art.

An embodiment of the present invention relates to a non-volatile memory device for floating a path of a leakage current when a column switch is turned off, resulting in the prevention of the leakage current.

In accordance with one embodiment of the present invention, the non-volatile memory device includes a cell array, a local column switch configured to selectively connect a bit line of the cell array to a global bit line in response to a column selection signal, a global column switch configured to selectively connect the global bit line to a sense amplifier in response to an enable signal, and a switching unit configured to control a current path passing through the local column switch and the global column switch in response to a control signal corresponding to an active operation.

In accordance with another embodiment of the present invention, the non-volatile memory device includes a plurality of cell arrays arranged in row and column directions, a plurality of local column switches configured to select column lines of the cell arrays, the local column switches including a first group of local column switches and a second group of local column switches, a plurality of global column switches including a first global column switch and a second global column switch, the first global column switch being assigned to the first group of local column switches, the second global column switch being assigned to the second group of local column switches, the global column switches configured to select a global bit line in cooperation with the local column switches, and a switching unit configured to control a current path passing through the local column switches and the global column switches in response to a control signal corresponding to an active operation.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1A:
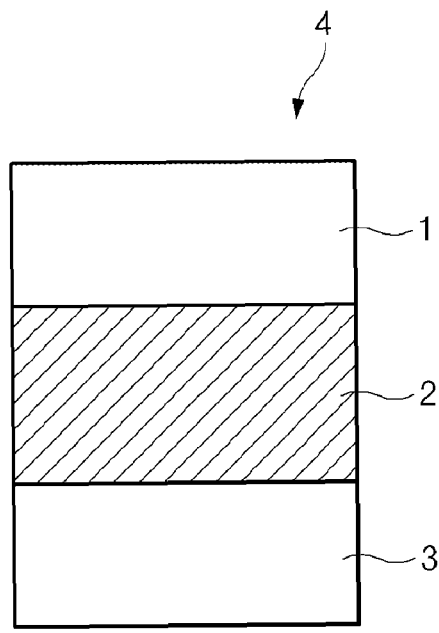
FIGS. 1A and 1B illustrate a conventional phase change resistor (PCR) element.
Figure 1B:
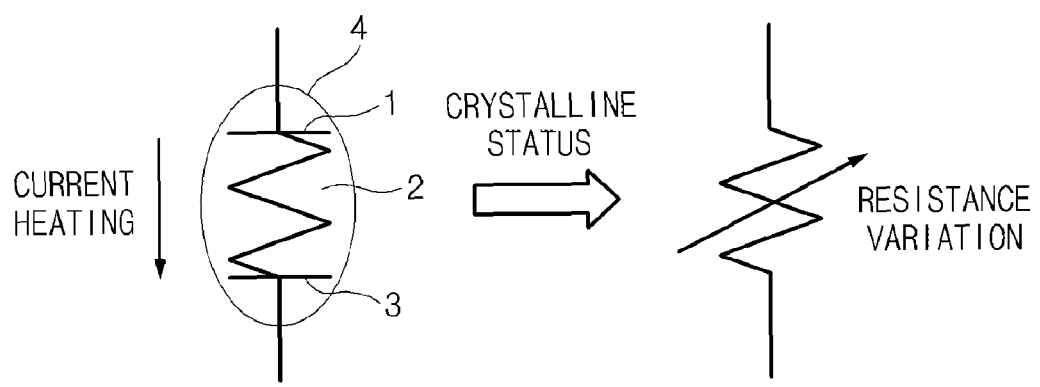
Figure 2A:
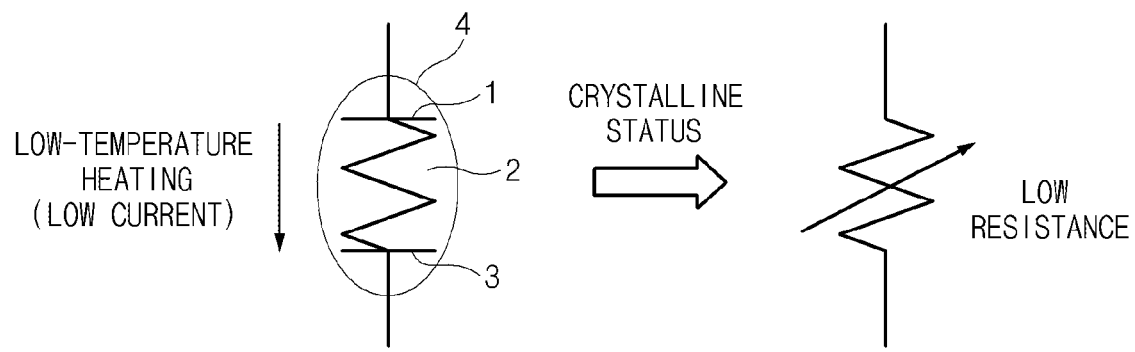
FIGS. 2A and 2B illustrate a phase change principle of the conventional PCR element.
Figure 2B:
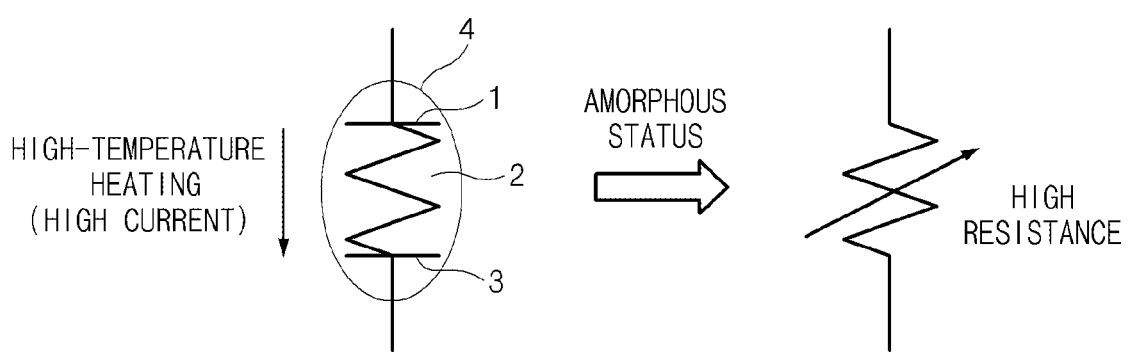
Figure 3:
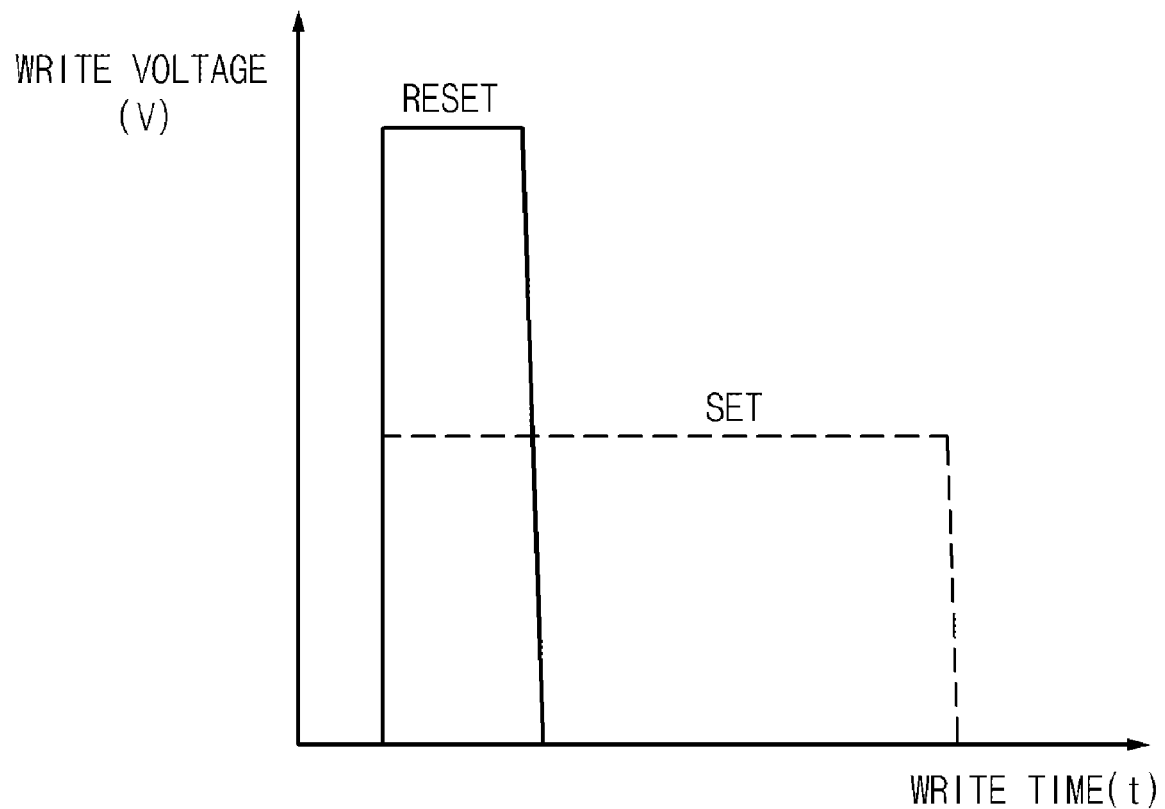
FIG. 3 illustrates a write operation of a conventional PCR cell.
Figure 4:
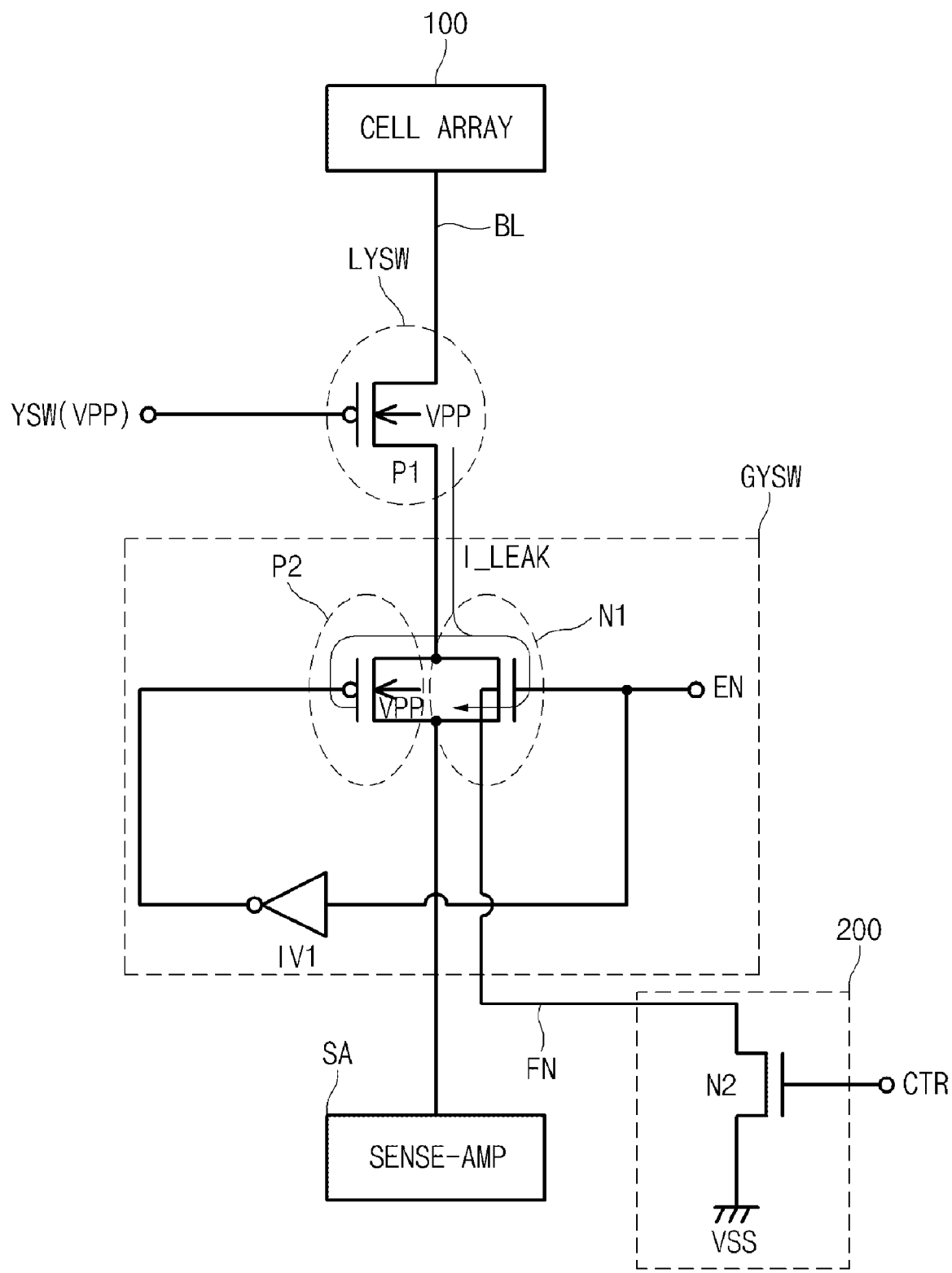
FIG. 4 is a circuit diagram illustrating a non-volatile memory device according to an embodiment of the present invention.

FIG. 4 is a circuit diagram illustrating a non-volatile memory device according to an embodiment of the present invention.

Referring to FIG. 4, the non-volatile memory device includes a cell array 100, a local column switch LYSW, a global column switch GYSW, and a switching unit 200.

In this case, the local column switch LYSW includes a PMOS transistor P1 for selectively connecting a bit line BL of the cell array 100 to a global bit line. The PMOS transistor P1 is connected between the bit line BL and the global column switch GYSW and receives a column selection signal YSW through a gate terminal.

The global column switch GYSW includes a PMOS transistor P2, an NMOS transistor N1 and an inverter IV1 such that it selectively connects the global bit line to a sense amplifier SA.

The NMOS transistor N1 is connected between the local column switch LYSW and the sense amplifier SA and receives an enable signal EN through a gate terminal. The PMOS transistor P2 is connected between the local column switch LYSW and the sense amplifier SA and receives an inverted enable signal output from the inverter IV1 through a gate terminal.

The switching unit 200 controls a body voltage of the NMOS transistor N1 in response to a control signal CTR.

The switching unit 200 includes an NMOS transistor N2. A drain terminal of the NMOS transistor N2 is connected to a body of the NMOS transistor N1. The control signal CTR is input to a gate terminal of the NMOS transistor N2, and a source terminal of the NMOS transistor N2 is connected to a ground voltage terminal.

Operations of the embodiments of the present invention will hereinafter be described in detail.

During read and write operations of data, if the column selection signal YSW goes to a low level and is input to the local column switch LYSW, the PMOS transistor P1 contained in the local column switch LYSW is turned on so that the bit line BL is connected to the global column switch GYSW through the PMOS transistor P1. On the other hand, during a standby operation, if the column selection signal YSW goes to a high level and is input to the local column switch LYSW, the PMOS transistor P1 is turned off so that the connection between the bit line BL and the global column switch GYSW is severed.

In this case, if the column selection signal YSW is in a high level, a pumping voltage VPP is input to the gate terminal and a body of the PMOS transistor P1.

If the enable signal EN is in a high level and input to the global column switch GYSW, both of the NMOS transistor N1 and the PMOS transistor P2 are turned on. In this case, when a certain bank in the cell array 100 is activated by the execution of the read or write operation, the enable signal EN corresponding to the bank goes to a high level. Therefore, data received from the local column switch LYSW is output to the sense amplifier SA.

On the other hand, if the enable signal EN is in a low level and input to the global column switch GYSW, both of the NMOS transistor N1 and the PMOS transistor P2 are turned off. In this case, during the standby operation in which the bank is not activated (i.e., deactivated), the enable signal EN goes to a low level. Therefore, the connection between the local column switch LYSW and the sense amplifier SA is severed.

In the switching unit 200, if the control signal CTR is activated to a high level, the NMOS transistor N2 is turned on. If the NMOS transistor N2 is turned on, a body terminal of the NMOS transistor N1 is connected to the ground voltage terminal.

On the other hand, if the control signal CTR is deactivated to a low level, the NMOS transistor N2 is turned off. If the NMOS transistor N2 is turned off, the body terminal of the NMOS transistor N1 is connected to a floating node FN and enters a floating status.

In this case, the control signal CTR is associated with a bank active operation. During the read or write operation, if the bank is activated, the control signal CTR is activated to a high level. On the other hand, during the standby operation in which the bank is deactivated, the control signal CTR is deactivated to a low level.

The pumping voltage VPP of a high level is input to a body terminal of the PMOS transistor P1 of the local column switch LYSW. In addition, a ground voltage VSS of a low level is input to the body terminal of the NMOS transistor N1 of the global column switch GYSW.

Therefore, although the local column switch LYSW and the global column switch GYSW are turned off, a leakage current I_LEAK flows from the PMOS transistor P1 having a high-level body voltage to the NMOS transistor N1 having a low-level body voltage.

That is, if there is a great difference between a gate bias and a drain bias prior to a break-down voltage, the leakage current I_LEAK flows from a drain terminal of the NMOS transistor N1 to a substrate. In this case, the leakage current I_LEAK corresponds to a leakage current caused by gate induced drain leakage (GIDL).

However, in accordance with the embodiment of the present invention, under the condition that the bank is not activated, and thus the local column switch LYSW and the global column switch GYSW are turned off, the control signal CTR goes to a low level. Therefore, if the bank is deactivated, the connection between the floating node FN and the ground voltage (VSS) terminal is severed so that the floating node FN enters the floating status.

In this case, the body terminal of the NMOS transistor N1 is floated, so that a bulk bias level of the NMOS transistor N1 is increased to prevent the leakage current I_LEAK from flowing in a bulk terminal of the NMOS transistor N1.

Figure 5:
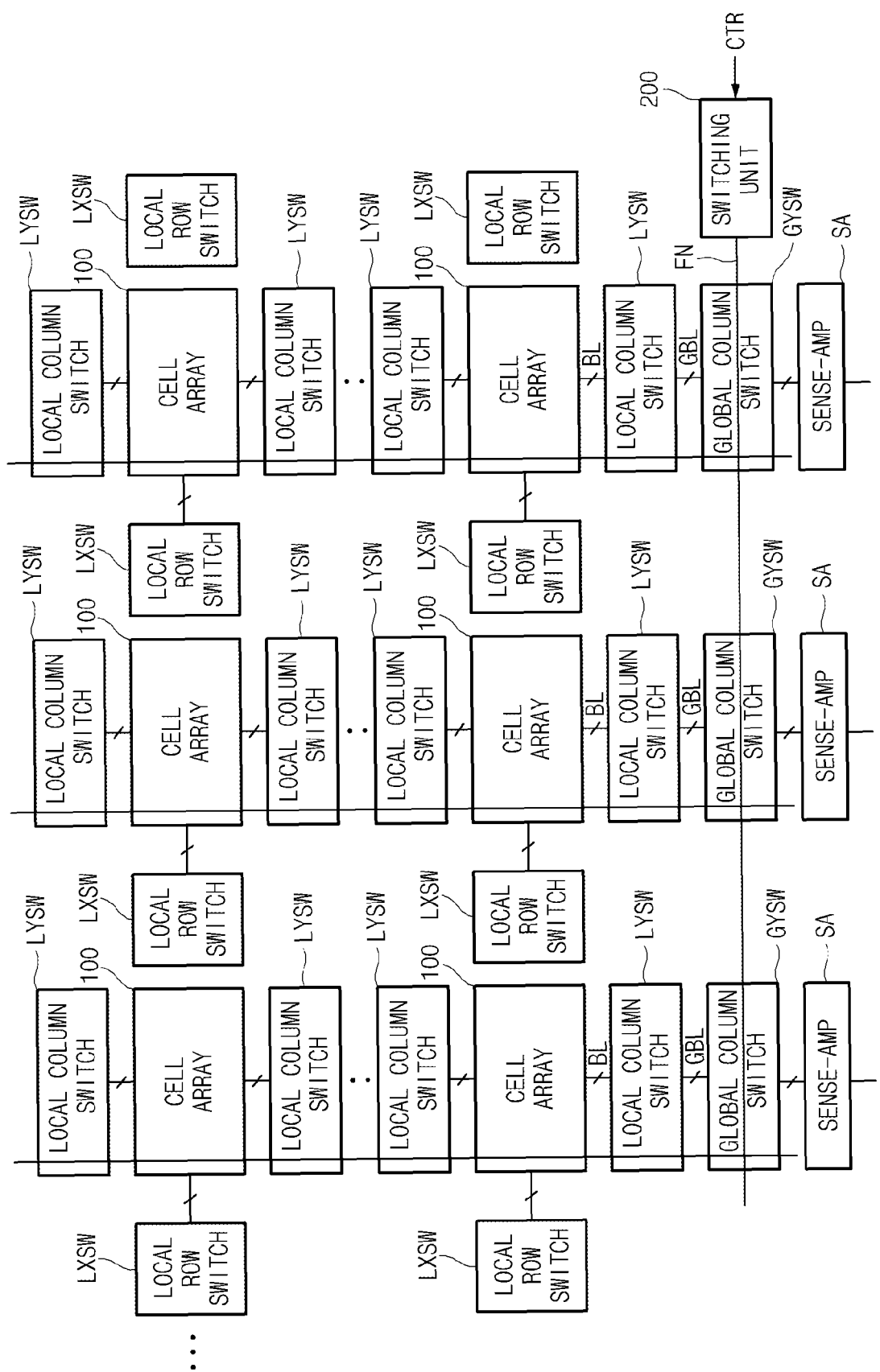
FIG. 5 is a block diagram illustrating a non-volatile memory device according to an embodiment of the present invention.

FIG. 5 is a block diagram illustrating a non-volatile memory device including the constituent elements shown in FIG. 4 according to an embodiment of the present invention.

Referring to FIG. 5, the non-volatile memory device includes a cell array 100, a local row switch LXSW, a local column switch LYSW, a global column switch GYSW, a switching unit 200, and a sense amplifier SA.

The non-volatile memory device allows the sense amplifier SA to sense data stored in a plurality of unit cells, and thus outputs the sensed data.

A plurality of cell arrays 100 are arranged in row and column directions, and include unit cells. Each unit cell includes a memory element, and data is stored in the memory element.

In the embodiment shown in FIG. 5, the memory element may be any one of various non-volatile memory elements including a ferroelectric capacitor, a phase change resistor, a spin torque transfer (STT) element, a magneto-resistive element, and the like.

Specifically, if the phase change resistor is used in the unit cell, the unit cell may include a switching element. Herein, the switching element controls a current to flow in only one of a first direction from a bit line to a word line and a second direction from the word line to the bit line. A MOS transistor, a diode, or the like may be used as the switching element as necessary.

The local column switches LYSW are formed at upper and lower parts of the cell array 100, such that one bit line BL is selected from among several bit lines. In this case, the local column switches LYSW are formed in a column direction (i.e., in a vertical direction) on the basis of the cell array 100.

The global column switches GYSW are formed at the bottom of the local column switch LYSW, thereby selectively controlling the connection between a global bit line GBL and the sense amplifier SA.

The cell array 100 may include a plurality of column lines and a plurality of row lines. A unit cell may be formed at an intersection area between each column line and each row line.

The local row switches LXSW can select a specific row line of the cell array 100 in response to input row addresses and are arranged at right and left sides of the cell array 100. In this case, the local row switches LXSW are arranged in a row direction (i.e., in a horizontal direction) on the basis of the cell array 100. Likewise, the local column switch LYSW and the global column switch GYSW can select a specific column line in response to a column selection signal YSW generated from input column addresses.

In this case, the local column switches LYSW are connected to a single global column switch GYSW. As can be seen from FIG. 4, a small amount of the leakage current I_LEAK may be generated from each local column switch LYSW.

However, as shown in FIG. 5, since the local column switches LYSW share only one global column switch GYSW, the leakage current I_LEAK generated from each local column switch LYSW leaks out to a body terminal of the global column switch GYSW.

Therefore, if the local column switches LYSW are configured to share only one global column switch GYSW in a specific structure, an amount of the leakage current I_LEAK generated from the global column switch GYSW may be substantial. As a result, an unexpected current is consumed in a standby mode, such that it is unfavorable in terms of power consumption.

Accordingly, a path of a leakage current generated from the global column switch GYSW is floated through a floating node FN activated in response to an operation of the switching unit 200, resulting in a reduced leakage current.

The sense amplifier SA senses data stored in a unit cell connected to a bit line BL selected by the local column switch LYSW and the global column switch GYSW, such that it generates sensed data.

The switching unit 200 is connected to several global column switches GYSW, such that it selectively connects the global column switches GYSW to the ground voltage (VSS) terminal in response to the control signal CTR. If the bank does not perform the read or write operation, the floating node FN connected to each global column switch GYSW enters the floating status. In this case, the global column switches GYSW share only one floating node.

Figure 6:
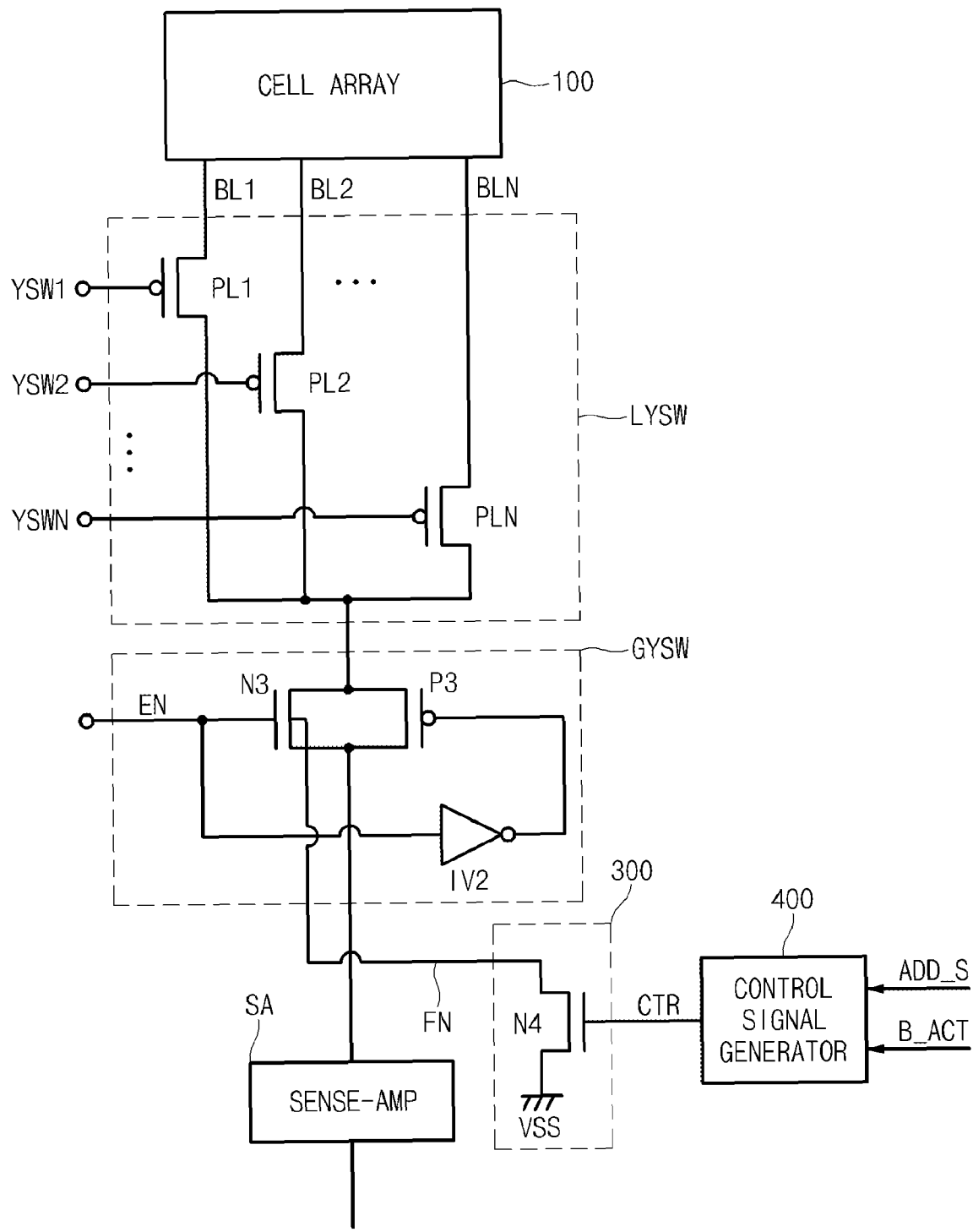
FIG. 6 is a circuit diagram illustrating a non-volatile memory device according to another embodiment of the present invention.

FIG. 6 is a circuit diagram illustrating a non-volatile memory device according to another embodiment of the present invention.

Referring to FIG. 6, the non-volatile memory device includes a cell array 100, a local column switch LYSW, a global column switch GYSW, a switching unit 300, and a control signal generator 400.

The local column switch LYSW includes a plurality of PMOS transistors PL1~PLN. The PMOS transistors PL1~PLN are connected between the global column switch GYSW and bit lines BL1~BLN and receive corresponding column selection signals YSW1~YSWN through gate terminals.

The global column switch GYSW includes a PMOS transistor P3, an NMOS transistor N3, and an inverter IV2.

The NMOS transistor N3 is connected between the local column switch LYSW and the sense amplifier SA and receives an enable signal EN through a gate terminal. The PMOS transistor P3 is connected between the local column switch LYSW and the sense amplifier SA and receives an inverted enable signal output from the inverter IV2 through a gate terminal.

The switching unit 300 controls a body voltage of the NMOS transistor N3 in response to a control signal CTR.

The switching unit 300 includes an NMOS transistor N4. A drain terminal of the NMOS transistor N4 is connected to a body of the NMOS transistor N3. The control signal CTR is input to a gate terminal of the NMOS transistor N4, and a source terminal of the NMOS transistor N4 is connected to a ground voltage (VSS) terminal.

The control signal generator 400 generates the control signal CTR in response to an address selection signal ADD_S and a bank active signal B_ACT, and outputs the generated control signal CTR to the switching unit 300.

Operations of the non-volatile memory device illustrated in FIG. 6 will be described hereinafter.

The local column switch LYSW according to this embodiment selects only one bit line BL from among the bit lines BL1~BLN in response to a plurality of column selection signals YSW1~YSWN.

For example, the local column switch LYSW includes a plurality of PMOS transistors PL1~PLN. The PMOS transistors PL1~PLN are selectively turned on or off in response to the corresponding column selection signals YSW1~YSWN input to gate terminals thereof.

Under the condition that the column selection signal YSW1 goes to a low level and is input to the local column switch LYSW, if each of the remaining column selection signals YSW2~YSWN goes to a high level, only the PMOS transistor PL1 is turned on. As a result, the sense amplifier SA can sense data stored in a unit cell connected to the bit line BL1.

On the other hand, if the column selection signal YSW1 is in a high level during the standby operation, the PMOS transistor PL1 contained in the local column switch LYSW is turned off, so that the connection between the bit line BL1 and the global column switch GYSW is severed.

If the enable signal EN is in a high level and input to the global column switch GYSW, the NMOS transistor N3 and the PMOS transistor P3 are turned on. Therefore, the global column switch GYSW can output data received from the local column switch LYSW to the sense amplifier SA.

On the other hand, if the enable signal EN is in a low level and input to the global column switch GYSW, the NMOS transistor N3 and the PMOS transistor P3 are turned off. As a result, the connection between the local column switch LYSW and the sense amplifier SA is severed.

If the control signal CTR is activated to a high level and input to the switching unit 300, the NMOS transistor N4 of the switching unit 300 is turned on. If the NMOS transistor N4 is turned on, a body terminal of the NMOS transistor N3 is connected to the ground voltage (VSS) terminal.

On the other hand, if the control signal CTR is deactivated to a low level and input to the switching unit 300, the NMOS transistor N4 of the switching unit 300 is turned off. If the NMOS transistor N4 is turned off, the body terminal of the NMOS transistor N3 is connected to a floating node FN and enters a floating status.

The control signal CTR is generated from the control signal generator 400. The control signal generator 400 controls the control signal CTR in response to the address selection signal ADD_S and the bank active signal B_ACT. The bank active signal B_ACT is associated with the bank active operation, and the address selection signal ADD_S is activated when a bank, row or column address is selected.

Therefore, during the read or write operation, if the bank is activated by a combination of the bank active signal B_ACT and the address selection signal ADD_S, the control signal generator 400 activates the control signal CTR to a high level. On the other hand, during the standby operation in which the bank is not activated, the control signal generator 400 deactivates the control signal CTR to a low level in response to the bank active signal B_ACT and the address selection signal ADD_S.

A high-level pumping voltage VPP is input to individual body terminals of the PMOS transistors PL1~PLN contained in the local column switch LYSW. In addition, a low-level ground voltage VSS is input to a body terminal of the NMOS transistor N3 contained in the global column switch GYSW.

Therefore, although the local column switch LYSW and the global column switch GYSW are turned off, a leakage current flows from each of the PMOS transistors PL1~PLN having a high-level body voltage to the NMOS transistor N3 having a low-level body voltage.

However, according to the embodiment of the present invention, when the local column switch LYSW and the global column switch GYSW are turned off due to deactivation of the bank, the control signal CTR is in a low level. Therefore, according to the embodiment of the present invention, when the bank is deactivated, the connection between the floating node FN and the ground voltage (VSS) terminal is severed, and the floating node FN enters the floating status, so that the resultant floating node FN having the floating status prevents an unnecessary leakage current from flowing from the PMOS transistors PL1~PLN to the NMOS transistor N3.

As apparent from the above description, the above-mentioned exemplary embodiments of the present invention have the following characteristics.

The non-volatile memory device according to an embodiment of the present invention controls a leakage-current path to be floated when a column switch used for column selection is turned off, resulting in the prevention of a leakage current.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A non-volatile memory device comprising:
a cell array;
a local column switch configured to selectively connect a bit line of the cell array to a global bit line in response to a column selection signal;
a global column switch configured to selectively connect the global bit line to a sense amplifier in response to an enable signal; and
a switching unit configured to control a current path passing through the local column switch and the global column switch in response to a control signal corresponding to an active operation.

2. The non-volatile memory device according to claim 1, wherein the switching unit, in response to the control signal that is activated during the active operation, is configured to sever a connection between a body terminal of the global column switch and a ground voltage terminal to allow a body of the global column switch to be in a floating state.

3. The non-volatile memory device according to claim 1, wherein the local column switch includes a transistor configured to receive a pumping voltage through a gate terminal and a body terminal.

4. The non-volatile memory device according to claim 1, wherein the global column switch includes a first transistor and a second transistor which are configured to connect the global bit line to the sense amplifier during activation of the enable signal and sever the connection between the global bit line and the sense amplifier during deactivation of the enable signal.

5. The non-volatile memory device according to claim 4, wherein the enable signal is deactivated to a low level during a standby mode such that the first transistor and the second transistor are turned off.

6. The non-volatile memory device according to claim 1, wherein the switching unit includes a third transistor that is connected between a body terminal of the global column switch and a ground voltage terminal and receives the control signal through a gate terminal.

7. The non-volatile memory device according to claim 6, wherein the third transistor connects the body terminal to the ground voltage terminal if the control signal is activated during the active operation, and connects the body terminal to a floating node if the control signal is deactivated during a standby mode.

8. The non-volatile memory device according to claim 7, wherein the global column switch is turned off when the body terminal is connected to the floating node.

9. The non-volatile memory device according to claim 1, further comprising a control signal generator configured to generate the control signal in response to an address selection signal and a bank active signal.

10. The non-volatile memory device according to claim 9, wherein the control signal generator activates and outputs the control signal when the address selection signal and the bank active signal are activated.

11. A non-volatile memory device comprising:
a plurality of cell arrays arranged in row and column directions;
a plurality of local column switches configured to select column lines of the cell arrays, the local column switches including a first group of local column switches and a second group of local column switches;
a plurality of global column switches including a first global column switch and a second global column switch, the first global column switch being assigned to the first group of local column switches, the second global column switch being assigned to the second group of local column switches, the global column switches configured to select a global bit line in cooperation with the local column switches; and
a switching unit configured to control a current path passing through the local column switches and the global column switches in response to a control signal corresponding to an active operation.

12. The non-volatile memory device according to claim 11, wherein the global column switches are arranged in a row direction and share a floating node of the switching unit.

13. The non-volatile memory device according to claim 11, wherein the current path is formed from the local column switches to a ground voltage terminal through the plurality of global column switches during the active operation.

14. The non-volatile memory device according to claim 11, wherein the switching unit, in response to the control signal that is activated during the active operation, severs the connection between a body terminal of each of the global column switches and a ground voltage terminal to allow a body of each of the global column switches to be in a floating status.

15. The non-volatile memory device according to claim 11, wherein each of the local column switches includes a transistor receiving a pumping voltage through a gate terminal and a body terminal.

16. The non-volatile memory device according to claim 11, wherein each of the global column switches includes a first transistor and a second transistor which are configured to connect the global bit line to the sense amplifier during activation of the enable signal and to sever the connection between the global bit line and the sense amplifier during deactivation of the enable signal.

17. The non-volatile memory device according to claim 16, wherein the enable signal is deactivated to a low level during a standby mode such that the first transistor and the second transistor are turned off.

18. The non-volatile memory device according to claim 11, wherein the switching unit includes a third transistor that is connected between a body terminal of each global column switch and a ground voltage terminal and receives the control signal through a gate terminal.

19. The non-volatile memory device according to claim 18, wherein the body terminal of the third transistor is connected to the ground voltage terminal if the control signal is activated during the active operation, and to a floating node if the control signal is deactivated during a standby mode.

20. The non-volatile memory device according to claim 19, wherein each of the global column switches is turned off when a body terminal thereof is connected to the floating node.

21. The non-volatile memory device according to claim 11, further comprising a control signal generator configured to generate the control signal in response to an address selection signal and a bank active signal.

22. The non-volatile memory device according to claim 21, wherein the control signal generator activates and outputs the control signal when the address selection signal and the bank active signal are activated.

\* \* \* \* \*